(12) United States Patent
Kurotaki et al.

(10) Patent No.: US 7,893,608 B2
(45) Date of Patent: Feb. 22, 2011

(54) ORGANIC ELECTROLUMINESCENT ELEMENT AND DISPLAY DEVICE

(75) Inventors: Masayuki Kurotaki, Kanagawa (JP); Shigeyuki Matsunami, Kanagawa (JP); Yasunori Kijima, Tokyo (JP)

(73) Assignee: Sony Corporation, Tokyo (JP)

( * ) Notice: Subject to any disclaimer, the term of this patent is extended or adjusted under 35 U.S.C. 154(b) by 526 days.

(21) Appl. No.: 11/998,041

(22) Filed: Nov. 28, 2007

(65) Prior Publication Data

US 2008/0136322 A1    Jun. 12, 2008

(30) Foreign Application Priority Data

Dec. 7, 2006    (JP) .......................... P2006-330296

(51) Int. Cl.
*H01J 1/62*    (2006.01)
*H01J 63/04*    (2006.01)

(52) U.S. Cl. .................. 313/504; 313/483; 313/503; 313/505; 313/506

(58) Field of Classification Search .................. None
See application file for complete search history.

(56) References Cited

U.S. PATENT DOCUMENTS

| 2005/0095456 | A1* | 5/2005 | Takeda | 428/690 |
| 2005/0249972 | A1* | 11/2005 | Hatwar et al. | 428/690 |
| 2006/0231830 | A1* | 10/2006 | Matsuda | 257/40 |
| 2007/0194701 | A1* | 8/2007 | Ito et al. | 313/506 |
| 2008/0164809 | A1* | 7/2008 | Matsunami et al. | 313/504 |
| 2009/0039769 | A1* | 2/2009 | Matsunami et al. | 313/504 |

FOREIGN PATENT DOCUMENTS

| JP | 2006-324233 | 11/2006 |
| JP | 2007-227117 | 9/2007 |
| WO | WO 2005-091684 | 9/2005 |

\* cited by examiner

*Primary Examiner*—Nimeshkumar D Patel
*Assistant Examiner*—Natalie K Walford
(74) *Attorney, Agent, or Firm*—Robert J. Depke; Rockey, Depke & Lyons, LLC

(57) ABSTRACT

An organic electroluminescent element includes a light emitting unit provided between an anode and a cathode. The light emitting unit has a light emitting layer containing a phosphorescent material as a luminescent material and a photosensitizing layer formed adjacent to the light emitting layer. The photosensitizing layer contains a fluorescent light emitting material as a guest material.

7 Claims, 1 Drawing Sheet

ORGANIC ELECTROLUMINESCENT ELEMENT AND DISPLAY DEVICE

The present document contains subject matter related to Japanese Patent Application No. 2006-330296 filed in the Japanese Patent Office on Dec. 7, 2006, the entire content of which being incorporated herein by reference.

BACKGROUND OF THE INVENTION

Field of the Invention

The present invention relates to an organic electroluminescent element and a display device. More particularly, the present invention is concerned with an organic electroluminescent element which is advantageously applied to the construction using a phosphorescent material in a light emitting layer, and a display device using the organic electroluminescent element.

An organic electroluminescent element utilizing electroluminescence of an organic material has attracted attention as a luminescent device which is excellent in high-speed response and which enables high luminance light emission by low-voltage direct current driving.

The organic electroluminescent element is basically configured as a light emitting unit where organic layers, such as a hole transport layer and a light emitting layer are layered, is formed between an anode and a cathode. The light emitting unit has a construction in that, for example, a hole injection layer, a hole transport layer, a light emitting layer, and an electron transport layer, and optionally an electron injection layer or the like are layered in this order from the anode side, and each layer may be formed of a plurality of layers.

The organic electroluminescent element having the above construction exhibits rectification, and, when an electric field is applied across the anode and the cathode, an electron injected from the cathode and a hole injected from the anode are recombined in the light emitting layer to cause an exciton, and light emission occurs when the exciton becomes the ground state. Therefore, in the electroluminescent element having a hole transport layer formed, the hole transport layer serves as a blocking layer for electron to increase the recombination efficiency of the light emitting layer-hole transport layer interface, improving the light emission efficiency. In the electroluminescent element having an electron transport layer formed, the light emission and the electron or hole transport are separated, and carrier blocking is more effectively made, enabling efficient light emission.

In the organic electroluminescent element having a general construction, fluorescence caused when a molecule as an emission center changes from the singlet exciton to the ground state is utilized. In recent years, an organic electroluminescent element utilizing phosphorescence caused when the molecule changes from the triplet exciton, which is more frequently generated than the singlet exciton, to the ground state has drawn attention. The organic electroluminescent element utilizing phosphorescence is expected in principle to exhibit a light emission yield of 100%, which corresponds to four times of the organic electroluminescent element utilizing fluorescence.

With respect to the construction of the light emitting unit in the organic electroluminescent element utilizing phosphorescence, for example, a four-layer construction in which (1) a hole transport layer, (2) a light emitting layer, (3) an exciton diffusion preventing layer, and (4) an electron transport layer are stacked in this order from the anode side is disclosed. Examples of materials constituting the individual layers areas follows. (1) The hole transport layer includes, e.g., N4,N4'-dinaphthalene-1-yl-N4,N4'-diphenylbiphenyl-4,4'-diamine (α-NPD). (2) The light emitting layer includes a host material having, e.g., 4,4'-N,N'-dicarbazolebiphenyl (CBP) in the host material, an iridium-phenylpyridine complex {Ir(ppy)$_3$}, which is a phosphorescent material is incorporated as a dopant material. (3) The exciton diffusion preventing layer includes 2,9-dimethyl-4,7-diphenyl-1,10-phenanthroline (BCP). (4) The electron transport layer includes 8-hydroxyquinoline aluminum (Alq3) (see non-patent documents 1 and 2 below).

[Non-patent document 1] D. F. O'Brien, et. al., "Improved energy transfer in electrophosphorescent device", Applied Physics Letters (1999), Vol. 74, No. 3, p. 422

[Non-patent document 2] M. A. Baldo, et. al., "Very high-efficiency green organic light-emitting devices based on electrophosphorescence", Applied Physics Letters (1999) Vol. 75, No. 1, p. 4

SUMMARY OF THE INVENTION

However, when employing the device structure of the organic electroluminescent element using phosphorescence, it is difficult to fully utilize high light emission yield of the phosphorescent light emitting material.

Accordingly to an embodiment of the present invention, there is provide an organic electroluminescent element which is advantageous in that the light emission efficiency can be improved without changing the chromaticity of light generated by the light emitting layer using a phosphorescent light emitting material, thus enabling lower power consumption and higher light emission efficiency while maintaining the chromatic purity, and a display device using the organic electroluminescent element.

According to an embodiment of the present invention, the organic electroluminescent element has a light emitting unit provided between an anode and a cathode, and the light emitting unit contains a light emitting layer having a phosphorescent light emitting material as a luminescent material and a photosensitizing layer provided adjacent to the light emitting layer, the photosensitizing layer having a fluorescent material as a luminescent guest material.

As described in detail in the Examples below, it has been found that the organic electroluminescent element having the above construction can improve light emission efficiency (cd/A) without changing the chromaticity of light generated by the light emitting layer, as compared with an element having no photosensitizing layer.

DETAILED DESCRIPTION OF THE INVENTION

<Organic Electroluminescent Element>

Figure 1:
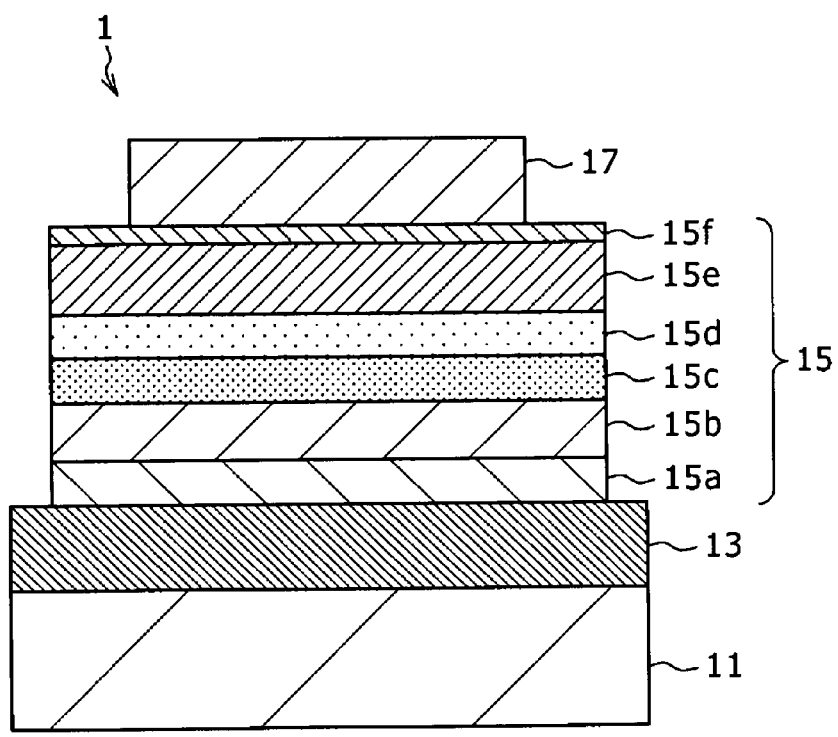
FIG. 1 is a cross-sectional view schematically showing an organic electroluminescent element according to an embodiment.

FIG. 1 is a cross-sectional view schematically showing an organic electroluminescent element of the present embodiment. An organic electroluminescent element 1 shown in the figure includes an anode 13, a light emitting unit 15, and a cathode 17 stacked in this order on a substrate 11. The light emitting unit 15 is a stacked material having a light emitting layer formed of at least an organic material.

Hereinbelow, the detailed constituents of the organic electroluminescent element 1 are individually described from the side of the substrate 11.

The substrate 11 includes a glass, silicon, plastic substrate or a thin film transistor (TFT) substrate having a TFT formed. Especially when the organic electroluminescent element 1 is of a transmissive type where light is emitted through the substrate 11, the substrate 11 is formed of materials having light transmission properties.

It is preferred that the anode 13 formed on the substrate 11 includes materials having a high work function. As such materials, for example, nickel, silver, gold, platinum, palladium, selenium, rhodium, ruthenium, iridium, rhenium, tungsten, molybdenum, chromium, tantalum, niobium, an alloy thereof, an oxide thereof, tin oxide, ITO, zinc oxide, or titanium oxide is used. The anode 13 including the materials may be of a layered structure where necessary. When the organic electroluminescent element 1 has a cavity structure and, for example, light reflected by the anode 13 and cathode 17 is emitted through the cathode 17, the anode 13 has a reflective material layer.

The light emitting unit 15 provided on the above anode 13 is formed by, for example, layering a hole injection layer 15a, a hole transport layer 15b, a light emitting layer 15c, a photosensitizing layer 15d which is characteristic in an embodiment, an electron transport layer 15e, and an electron injection layer 15f, in this order from the anode 13 side. Particularly, in the present embodiment, the characteristic feature resides in that the light emitting layer 15c including an organic material contains a phosphorescent material as a luminescent material, and that the photosensitizing layer 15d containing a fluorescent material as a guest material is stacked adjacent to the light emitting layer 15c.

The detailed constructions of the individual layers constituting the light emitting unit 15 are described below.

The hole injection layer 15a includes a general hole injection material, such as copper phthalocyanine (CuPc), 4,4',4"-tris(naphthylphenylamino)triphenylamine (TNATA), or 4,4', 4"-tris[N-(3-methylphenylphenylamino)]triphenylamine (m-MTDATA) and the like.

The hole transport layer 15b is formed by using a general hole transport material, such as a benzidine derivative, a styrylamine derivative, a triphenylmethane derivative, or a hydrazone derivative. The hole injection layer 15a may serve as the hole transport layer 15b.

The light emitting layer 15c contains a phosphorescent light emitting material as a luminescent guest material (luminescent material).

As the host material constituting the light emitting layer 15c, for example, a carbazole host is used, and specific examples include 4,4'-N,N'-dicarbazolebiphenyl (CBP) and bis-(2-methyl-8-quinolinolate)-4-(phenylphenolato)-aluminium (BAlq). As the host material, a material appropriately selected from the phosphorescent light emitting materials in accordance with the wavelength of light generated by the organic electroluminescent element 1 is used.

As the phosphorescent light emitting material constituting the light emitting layer 15c, a metal complex having Ir, Pt, Rh, Pd, Ru, or Os as a center metal is used, and specific examples include an iridium-phenylpyridine complex {Ir(ppy)$_3$}. A material appropriately selected from the phosphorescent light emitting materials according to the wavelength of light generated by the organic electroluminescent element 1 is used.

In the light emitting layer 15c, the phosphorescent material is contained in such an amount that the maximum light emission efficiency may be obtained. This amount of the phosphorescent light emitting material contained is determined by appropriately selecting the amounts of the phosphorescent material and host material. Further, the light emitting layer 15c containing the phosphorescent material in such an amount that the maximum light emission efficiency may be obtained has such a thickness that the maximum light emission efficiency is obtained.

The photosensitizing layer 15d contains a fluorescent light emitting material as a guest material. The fluorescent light emitting material generates light having a wavelength shorter than the wavelength of light generated by the phosphorescent light emitting material contained in the light emitting layer 15c.

As the host material constituting the photosensitizing layer 15d, a material which causes the guest material to emit light efficiently is selected, and the same material as that for the light emitting layer 15c may be used.

In the photosensitizing layer 15d, the fluorescent light emitting material is contained in such an amount that the maximum light emission efficiency may be obtained when the photosensitizing layer 15d itself serves as a light emitting layer. This amount of the fluorescent light emitting material contained is determined by appropriately selecting the amounts of the fluorescent light emitting material and host material.

When the host material of the light emitting layer 15c has a hole transport property and the light emission portion is positioned on the cathode 17 side, or when the element is of a top emission type where the light is extracted from the cathode 17 opposite the substrate 11, the photosensitizing layer 15d is provided adjacent to the cathode 17 side of the light emitting layer 15c as shown in the figure. On the other hand, when the host material of the light emitting layer 15c has an electron transport property and the light emission portion is positioned on the anode 13 side, or when light is emitted from the substrate 11 side, the photosensitizing layer 15d is provided adjacent to the anode 13 side of the light emitting layer 15c.

The electron transport layer 15e includes an electron transport material, such as an Alq (quinolinol aluminum complex), a phenanthroline derivative, an anthraquinodimethane derivative, a diphenylquinone derivative, an oxadiazole derivative, or a perylenetetracarboxylic acid derivative.

The electron injection layer 15f includes a general electron injection material, such as 2,9-dimethyl-4,7-diphenyl-1,10-phenanthroline (BCP).

The construction of the light emitting unit 15 is just an example, and the layers other than the light emitting layer 15c and photosensitizing layer 15d, and further another layer may be provided when necessary.

It is preferred that the cathode 17 formed on the light emitting unit 15 having the above construction is formed of a material having a small work function. As such a material, for example, magnesium, calcium, indium, lithium, aluminum, silver, or an alloy thereof is used. The cathode 17 including the above material may have a stacked structure when necessary. When the organic electroluminescent element 1 has a cavity structure and, for example, light reflected by the anode 13 and cathode 17 is extracted from the cathode 17 side, the cathode 17 has a semi-transmissive, semi-reflective material layer.

In the above construction, the cathode 17, light emitting unit 15, and anode 13 may be layered in this order from the substrate 11 side. Even in this case, layering order of the light emitting unit 15, the hole injection layer 15a is formed from the anode 13 side similarly.

In the above construction, the layer including organic materials may be formed by a vacuum deposition method, an offset printing method, a screen printing method, a laser transfer method, an ink-jet method, or a spin coating method.

As shown in the Examples later, it has been found that the organic electroluminescent element 1 having the above construction is improved in light emission efficiency (cd/A) without changing the chromaticity of light generated by the light emitting layer 15c, as compared to an element having no photosensitizing layer 15d.

The reason for this is presumed that the hole, which is not recombined and which has passed through the hole-transport light emitting layer 15c, is recombined with an electron within the photosensitizing layer 15d formed adjacent to the cathode 17's side of the light emitting layer 15c, and the energy generated is reabsorbed by the light emitting layer 15c and contributes to light emission in the light emitting layer 15c, thus enabling the light emitting layer 15c to fully utilize high quantum yield of the phosphorescent material to emit light.

Consequently, the organic electroluminescent element can be improved in light emission efficiency (cd/A) without changing the chromaticity of light generated by the light emitting layer using a phosphorescent material, thus enabling lower power consumption and higher light emission efficiency while maintaining the intensity of color.

Display Device

Figure 2:
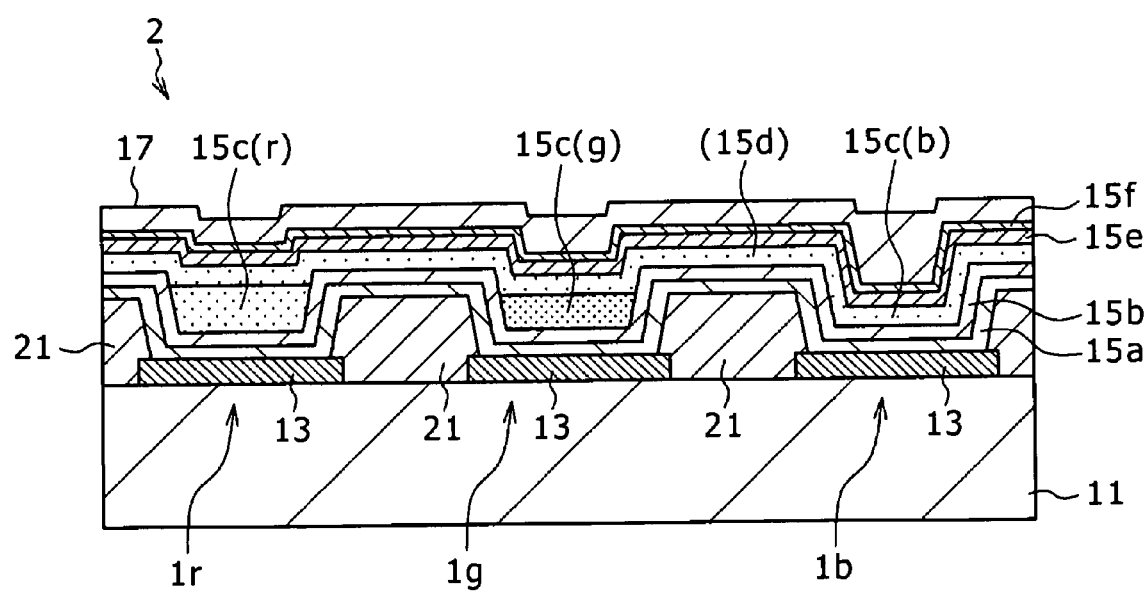
FIG. 2 is a view showing a construction example of a display device using the organic electroluminescent element according to an embodiment.

FIG. 2 is a view showing an example of the construction of a display device using the organic electroluminescent element 1 having the above construction.

The display device shown in the figure is a full-color display device having one group of an organic electroluminescent element emitting red (R) light (hereinafter, referred to as "red element") 1r, an organic electroluminescent element emitting green (G) light (hereinafter, referred to as "green element") 1g, and an organic electroluminescent element emitting blue (B) light (hereinafter, referred to as "blue element") 1b arranged on a substrate 11.

In the elements 1r, 1g, 1b, each of the red element 1r and the green element 1g has the same construction as that of the organic electroluminescent element 1 described above with reference to FIG. 1. On the other hand, the blue element 1b has a construction using a light emitting layer containing a fluorescent material.

The elements 1r, 1g, 1b have substantially the same constructions of individual layers except for the light emitting layer.

Specifically, in each of the elements 1r, 1g, 1b, the anode 13 is formed in the same step, and patterned per pixel. An insulating pattern 21 is formed to cover the edges of the anode.

Further, a hole injection layer 15a and a hole transport layer 15b are formed on the anode 13 as common layers to the elements 1r, 1g, 1b.

With respect to the light emitting layer, in the red element 1r and green element 1g, respectively, light emitting layers 15c(r), 15c(g) each containing a phosphorescent material are patterned in respective thicknesses. On the other hand, in the blue light emitting layer 1b, a light emitting layer 15c(b) containing a fluorescent material is formed.

Particularly, in the present embodiment, the characteristic feature resides in that the light emitting layer 15c(b) is formed as a common layer to the elements 1r, 1g, and 1b, and formed as a photosensitizing layer 15d on each of the light emitting layers 15c(r), 15c(g) in the red element 1r and green element 1g.

As an example of the blue light emitting layer 15c(b) (i.e., photosensitizing layer 15d), there can be mentioned a layer formed by using ADN as a host material and BD-052x (trade name; manufactured and sold by Idemitsu Kosan Co., Ltd.) as a blue light-emitting fluorescent material (dopant material). The layer is formed by depositing these materials by a vacuum deposition method such that the doping concentration of the dopant material becomes 5% (thickness ratio).

It is preferred that each of the light emitting layers 15c(r), 15c(g), 15c(b) (i.e., photosensitizing layer 15d) has a thickness arranged such that the light having a desired wavelength to be generated by the respective elements 1r, 1g, 1b resonates between the anode 13 and the cathode 17.

Each of the light emitting layers 15c(r), 15c(g), 15c(b) (i.e., photosensitizing layer 15d) contains the material in such a concentration that the light emission efficiency may be maximum. The patterning of the light emitting layers 15c(r), 15c(g) is performed by mask vapor deposition or laser transfer.

An electron transport layer 15e, an electron injection layer 15f, and a cathode 17 formed on the blue light emitting layer 15c(b) (i.e., photosensitizing layer 15d) are provided to the elements 1r, 1g, 1b as common layers.

In the display device 2 having the above-described construction, in the red element 1r and green element 1g, the blue light emitting layer 15c(b) containing a fluorescent light emitting material in the blue element 1b is formed adjacent to the cathode 17 side of the light emitting layer 15c(r) or 15c(g) containing a phosphorescent material. In this construction, the blue light emitting layer 15c(b) in the blue element 1b functions as the photosensitizing layer 15d in the red element 1r and green element 1g.

By virtue of having the above construction, the display device 2 including the RGB light-emitting elements 1r, 1g, 1b is advantageous in that there is no need to apply the blue light emitting layer 15c(b) only to the portion of the blue element 1b, making it possible to simplify the process. There is no appropriate material as a phosphorescent material emitting blue light at this stage. Therefore, the red element 1r and green element 1g each using phosphorescence and the blue element 1b using fluorescence are employed to realize the full-color display device 2 utilizing phosphorescence, thus reducing the cost of the display device 2.

EXAMPLES

Examples 1 to 4

The specific Examples of the present embodiment and manufacturing procedure of display element of Comparative Example 1 to the Examples and the results of evaluation thereof are described with reference to the Table 1 below.

TABLE 1

| | Light emitting layer 15c | | | Photosensitizing layer 15d | | Driving voltage | Light emission efficiency | |
|---|---|---|---|---|---|---|---|---|
| | Phosphorescent material | | | Fluorescent material | | | | |
| | Host | | Concentration | Host | Concentration | (V) | (cd/A) | Chromaticity |
| Ex. 1 | BAlq | Btp₂Ir(acac) | 1% | ADN | BD-052 2% | 8.0 | 13.9 | 0.63, 0.36 |
| Ex. 2 | | | | | 5% | 8.0 | 14.0 | 0.63, 0.36 |
| Ex. 3 | | | | | 10% | 7.8 | 13.9 | 0.63, 0.36 |
| Ex. 4 | | | | | 15% | 8.0 | 14.0 | 0.63, 0.36 |
| Ex. 5 | | | | | Structural formula (6) 5% | 8.0 | 13.9 | 0.63, 0.36 |
| Comp. Ex. 1 | | | | | — | 7.8 | 12.0 | 0.63, 0.36 |

On a substrate 11 formed of a 30 mm×30 mm glass plate, an ITO transparent electrode 12.5 nm in thick was first formed on an Ag alloy (reflective layer) having a thickness of 190 nm to form an anode 13 of a two-layer structure, preparing a cell for top emission-type organic electroluminescent element.

Then, m-MTDATA represented by the structural formula (1) below was deposited to form a film having a thickness of 12 nm as a hole injection layer 15a. The deposition rate was 0.2 to 0.4 nm/sec. m-MTDATA is 4,4',4"-tris(phenyl-m-tolylamino)triphenylamine.

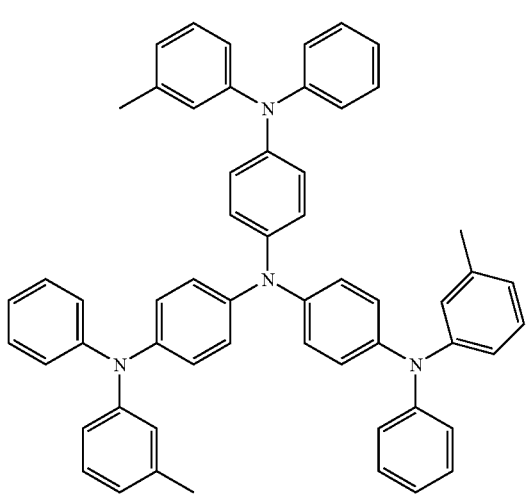

Formula (1) m-MTDATA

α-NPD represented by the structural formula (2) below was then deposited to form a film having a thickness of 12 nm as a hole transport layer 15b. The deposition rate was 0.2 to 0.4 nm/sec. However α-NPD is N,N'-bis(1-naphthyl)-N,N'-diphenyl(1,1'-biphenyl)-4,4'-diamine.

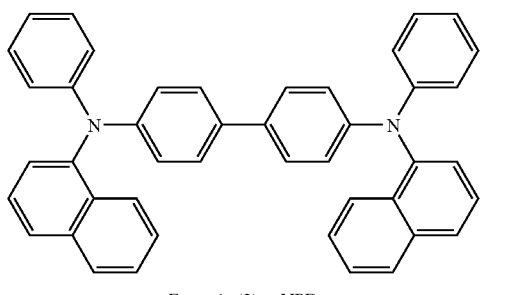

Formula (2) α-NPD

Subsequently, BAlq (host material) and Btp₂Ir(acac) (guest material) represented by the structural formula (3) below, which is a red phosphorescent material, were co-deposited at a guest concentration (relative thickness ratio) of 1% to form a film having a thickness of 30 nm as a light emitting layer 15c. BAlq is bis-(2-methyl-8-quinolinolate)-4-(phenylphenolato)-aluminium.

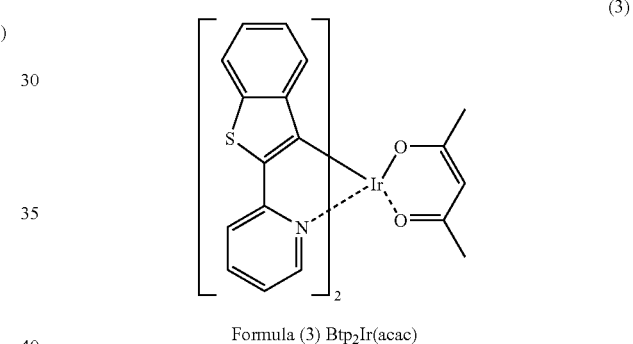

Formula (3) Btp₂Ir(acac)

Then, ADN (host material) represented by the structural formula (4) below and BD-052 (trade name; manufactured and sold by Idemitsu Kosan Co., Ltd.) (guest material), which is a blue fluorescent light emitting material, were co-deposited with a film doped at a guest concentration (relative thickness ratio) of 2%, 5%, 10%, or 15% having a thickness of 25 nm as a photosensitizing layer 15d. However, ADN is 9,10-di(2-naphthyl)anthracene.

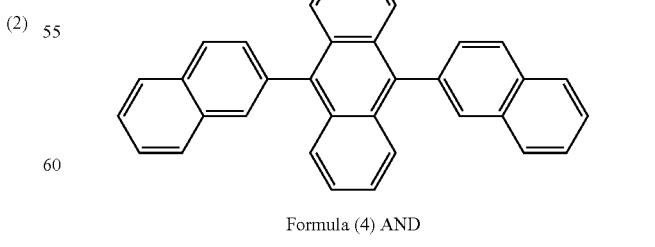

Formula (4) AND

Alq3 (8-hydroxyquinoline aluminum) represented by the structural formula (5) below was then deposited to form a film having a thickness of 10 nm as an electron transport layer 15e.

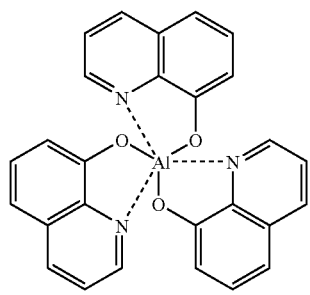

Formula (5) Alq3

An organic layer formed of the hole injection layer 15a, hole transport layer 15b, light emitting layer 15c, photosensitizing layer 15d, and electron transport layer 15e stacked on one another was formed as mentioned above and then, a film formed of LiF having a thickness of about 0.3 nm was formed by a vacuum deposition method (deposition rate: 0.01 nm/sec.) as a first layer 17a of a cathode 17. Finally, an MgAg film having a thickness of 10 nm was formed on the second layer 17a by a vacuum deposition method as a second layer 17b of the cathode 17.

Thus red light-emitting organic electroluminescent elements in Examples 1 to 4 having different guest fluorescent material concentrations of the photosensitizing layer 15d were prepared.

Example 5

In the formation of the photosensitizing layer 15d, co-deposition was conducted using, instead of BD-052 (trade name; manufactured and sold by Idemitsu Kosan Co., Ltd.) used as a blue fluorescent material (guest material), a blue fluorescent material (guest material) represented by the structural formula (6) below at a guest concentration (relative thickness ratio) of 5% to form a doped film having a thickness of 25 nm. A red light-emitting organic electroluminescent element was prepared in accordance with substantially the same procedure as in Examples 1 to 4.

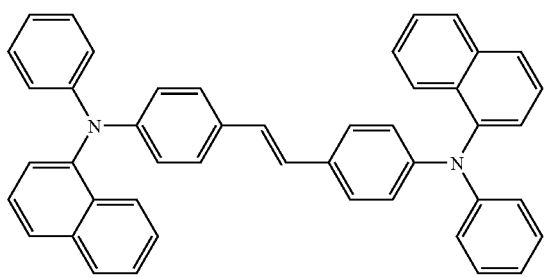

Formula (6)

Comparative Example 1

The photosensitizing layer 15d was not formed and Alq3 (8-hydroxyquinoline aluminum) was deposited to form a film having a thickness of 35 nm as an electron transport layer 15e so that the total thickness of the resultant organic film was the same as that in Examples 1 to 4, thus a red light-emitting organic electroluminescent element was prepared in accordance with substantially the same procedure as in Examples 1 to 4.

Evaluation Results 1

With respect to each of the thus prepared organic electroluminescent elements in Examples 1 to 5 and Comparative Example 1, a driving voltage (V) and a light emission efficiency (cd/A) at a current density of 10 mA/cm$^2$ and a chromaticity were measured. The results are shown in the Table 1 above.

As can be seen from the Table 1, light generated by each of the organic electroluminescent elements in Examples 1 to 5 and Comparative Example 1 using the same light emitting layer 15c is red light having a chromaticity (0.63, 0.36). This result has confirmed that, in the elements in Examples 1 to 5 of the present embodiment in which the photosensitizing layer 15d containing a blue fluorescent light emitting material is provided adjacent to the light emitting layer 15c containing a red phosphorescent light emitting material, the photosensitizing layer 15d does not adversely affect the red light emission of the light emitting layer 15c and the chromaticity of the generated light is maintained.

Further, it has been found that the light emission efficiency of each of the organic electroluminescent elements in Examples 1 to 5 of the present embodiment having the photosensitizing layer 15d is higher than that of the organic electroluminescent element in Comparative Example 1 having no photosensitizing layer 15d. The increase of the light emission efficiency by virtue of providing the photosensitizing layer 15d is apparent from a comparison of Examples 1 to 4 and Example 5, irrespective of the blue fluorescent light emitting material used in the photosensitizing layer 15d.

The effect of the present embodiment has been confirmed with respect to the red organic electroluminescent element.

Examples 6 to 9

The specific examples of the present embodiment, manufacturing method of a display element of Comparative Example 2 to the Examples and the results of evaluation thereof are described with reference to the Table 2 below.

TABLE 2

| | Light emitting layer 15c | | | Photosensitizing layer 15d | | Driving | Light emission | |
| | Phosphorescent material | | | Fluorescent material | | voltage | efficiency | |
| | Host | Concentration | Host | | Concentration | (V) | (cd/A) | Chromaticity |
|---|---|---|---|---|---|---|---|---|
| Ex. 6 | CBP | Ir(ppy)₃ 1% | ADN | BD-052 | 2% | 8.0 | 54.8 | 0.25, 0.67 |
| Ex. 7 | | | | | 5% | 8.0 | 55.0 | 0.25, 0.67 |
| Ex. 8 | | | | | 10% | 7.8 | 55.2 | 0.25, 0.67 |
| Ex. 9 | | | | | 15% | 7.9 | 55.5 | 0.25, 0.67 |
| Ex. 10 | | | | Structural formula (6) | 5% | 7.9 | 55.3 | 0.25, 0.67 |
| Comp. Ex. 2 | | | | Exciton diffusion preventing layer (BAlq) | | 7.4 | 45.2 | 0.25, 0.67 |

Films of the hole transport layer 15b was formed in the same manner as in Examples 1 to 4.

Then, CBP (host material) and Ir(ppy)₃ (guest material) represented by the structural formula (7) below, which is a green phosphorescent material, were co-deposited at a guest concentration (relative thickness ratio) of 1% to form a film having a thickness of 25 nm as a light emitting layer 15c. CBP is 4,4'-N,N'-dicarbazolebiphenyl.

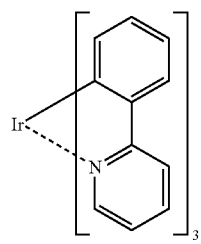

Formula (7) Ir(ppy)₃

Subsequently, co-deposition was conducted using the blue fluorescent material (guest material) in the same composition as that in Examples 1 to 4 at a guest concentration (relative thickness ratio) of 2%, 5%, 10%, or 15% to form a doped film having a thickness of 25 nm as a photosensitizing layer 15d.

Then, Alq3 (8-hydroxyquinoline aluminum) represented by the structural formula (5) below was deposited to form a film having a thickness of 20 nm as an electron transport layer 15e.

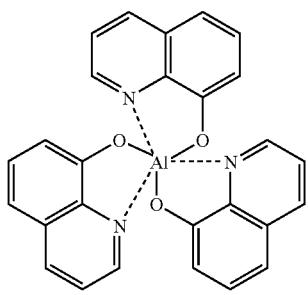

Formula (5) Alq3

An organic layer formed of the hole injection layer 15a, hole transport layer 15b, light emitting layer 15c, photosensitizing layer 15d, and electron transport layer 15e stacked on one another was formed as mentioned above and then, a cathode 17 was formed in the same manner as in Examples 1 to 4.

Thus green light-emitting organic electroluminescent elements in Examples 6 to 9 having different guest fluorescent light emitting material concentrations of the photosensitizing layer 15d was prepared.

Example 10

In the formation of the photosensitizing layer 15d according to example 6 to 9, co-deposition was conducted using, instead of BD-052 (trade name; manufactured and sold by Idemitsu Kosan Co., Ltd.) used as a blue fluorescent light emitting material (guest material), a blue fluorescent material (guest material) represented by the structural formula (6) below at a guest concentration (relative thickness ratio) of 5% to form a doped film having a thickness of 25 nm. A green light-emitting organic electroluminescent element was prepared in accordance with substantially the same procedure as in Examples 6 to 9 regarding other procedure.

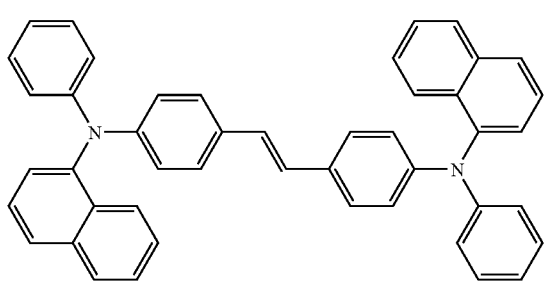

Formula (6)

Comparative Example 2

The photosensitizing layer 15d was not formed and, instead, BAlq was deposited to form a film having a thickness of 10 nm as an exciton diffusion preventing layer according to manufacturing procedures of example 6 to 10, and Alq3 (8-hydroxyquinoline aluminum) was deposited to form a film having a thickness of 35 nm as an electron transport layer 15e so that the total thickness of the resultant organic film was the same as that in Examples 6 to 9. A green light-emitting organic electroluminescent element was prepared in accordance with substantially the same procedure as in Examples 6 to 9.

Evaluation Results 2

With respect to each of the thus prepared organic electroluminescent elements in Examples 6 to 10 and Comparative Example 2, a driving voltage (V) and a light emission efficiency (cd/A) at a current density of 10 mA/cm$^2$ and a chromaticity were measured. The results are shown in the Table 2 above.

As can be seen from the Table 2, light generated by each of the organic electroluminescent elements in Examples 6 to 10 and Comparative Example 2 using the same light emitting layer 15c is green light having a chromaticity (0.25, 0.67). This result has confirmed that, in the elements in Examples 6 to 10 of the present embodiment in which the photosensitizing layer 15d containing a blue fluorescent material is provided adjacent to the light emitting layer 15c containing a green phosphorescent material, the photosensitizing layer 15d does not adversely affect the green light emission of the light emitting layer 15c and the chromaticity of the light generated is maintained.

Further, it has been found that the light emission efficiency of each of the organic electroluminescent elements in Examples 6 to 10 of the present embodiment having the photosensitizing layer 15d is higher than that of the organic electroluminescent element in Comparative Example 2 having no photosensitizing layer 15d. The increase of the light emission efficiency by virtue of providing the photosensitizing layer 15d is apparent from a comparison of Examples 6 to 9 and Example 10, irrespective of the blue fluorescent light emitting material used in the photosensitizing layer 15d.

The effect of embodiments of the present invention has been confirmed with respect to the green organic electroluminescent element.

As described above, in an embodiment of the present invention, the organic electroluminescent element can be improved in light emission efficiency (cd/A) without changing the chromaticity of light generated by the light emitting layer using a phosphorescent light emitting material, thus enabling lower power consumption and higher light emission efficiency while maintaining the intensity of color.

It should be understood by those skilled in the art that various modifications, combinations, sub-combinations and alterations may occur depending on design requirements and other factors insofar as they are within the scope of the appended claims or the equivalents thereof.

What is claimed is:

1. An organic electroluminescent element including a light emitting unit provided between an anode and a cathode, the light emitting unit having
    a light emitting layer containing a phosphorescent material as a luminescent material; and
    a photosensitizing layer formed adjacent to the light emitting layer, the photosensitizing layer containing a fluorescent light emitting material as a guest material, and further wherein light energy generated within the photosensitizing layer is reabsorbed by the light emitting layer and thereby causes additional light emission from the light emitting layer.

2. The organic electroluminescent element according to claim 1, wherein:
    the fluorescent light emitting material generating light having a wavelength shorter than the wavelength of light generated by the phosphorescent material is contained in the photosensitizing layer.

3. The organic electroluminescent element according to claim 1, wherein:
    the phosphorescent material is contained in the light emitting layer as a luminescent guest material; and
    the photosensitizing layer is provided adjacent to the cathode side of the light emitting layer.

4. The organic electroluminescent element according to claim 3, wherein:
    a light generated by the light emitting layer is extracted from the cathode side.

5. A display device including a plurality of organic electroluminescent elements arranged on a substrate,
    each organic electroluminescent element having a light emitting unit provided between an anode and a cathode, the light emitting unit, wherein:
    the light emitting unit has
    a light emitting layer containing a phosphorescent material as a luminescent material; and
    a photosensitizing layer formed adjacent to the light emitting layer, the photosensitizing layer containing a fluorescent light emitting material as a luminescent guest material, and further wherein light energy generated within the photosensitizing layer is reabsorbed by the light emitting layer and thereby causes additional light emission from the light emitting layer.

6. The display device according to claim 5, wherein:
    the photosensitizing layer serves as the light emitting layer.

7. The display device according to claim 5, wherein:
    the photosensitizing layer is formed as a common layer to a plurality of organic electroluminescent elements.

* * * * *